United States Patent [19]

Nishikubo

[11] 4,388,001
[45] Jun. 14, 1983

[54] ELECTRONIC TIMEPIECE

[75] Inventor: Yasuhiko Nishikubo, Tokorozawa, Japan

[73] Assignee: Citizen Watch Co., Ltd., Tokyo, Japan

[21] Appl. No.: 192,714

[22] Filed: Oct. 1, 1980

[30] Foreign Application Priority Data

Oct. 9, 1979 [JP]  Japan .......................... 54-139154[U]

[51] Int. Cl.$^3$ ......................... G04C 19/00; B01J 17/00
[52] U.S. Cl. ......................................... 368/87; 29/571; 29/577 C
[58] Field of Search ..................................... 368/85–87, 368/217–219; 29/577, 577 C, 571; 148/175, 187; 357/41, 51, 59

[56] References Cited

U.S. PATENT DOCUMENTS

| 3,354,360 | 11/1967 | Canpagna et al. | 29/577 IC |
| 3,484,932 | 12/1969 | Cook, Jr. | 29/577 IC |
| 4,070,748 | 1/1978 | Legat et al. | 29/577 C |
| 4,161,417 | 3/1979 | Yim et al. | 29/571 |
| 4,167,804 | 9/1979 | Greenstein | 29/577 C |

OTHER PUBLICATIONS

IEEE Transactions on Nuclear Science, vol. 25 #6, Dec. 1978, "Latch-Up Screening of LSI Devices", p. 1534.
IEEE Transaction on Nuclear Science, vol. 26, #6, Dec. 1979, "Latch-Up Control in CMOS Integrated Circuits", p. 5065.

Primary Examiner—Vit W. Miska
Attorney, Agent, or Firm—Birch, Stewart, Kolasch & Birch

[57] ABSTRACT

An electronic timepiece having a quartz crystal oscillator for producing a time standard signal, a frequency divider, and a display device. A CMOS integrated circuit on an N-type substrate is provided for the elements. A first aluminum lead and a second aluminum lead are provided on the CMOS integrated circuit. The first aluminum lead is provided on the CMOS integrated circuit to connect the high potential side of voltage supply to the N-type substrate. The second aluminum lead is provided on the CMOS integrated circuit for supplying the voltage to a logic circuit in the CMOS integrated circuit. A resistor is provided between the second aluminum lead and high potential side of the voltage supply for preventing the latch-up of the CMOS integrated circuit.

5 Claims, 3 Drawing Figures

ELECTRONIC TIMEPIECE

BACKGROUND OF THE INVENTION

This invention relates to a quartz crystal electronic timepiece comprising a quartz crystal oscillator for producing a time standard signal and a frequency divider for dividing the frequency of the time standard signal to predetermined frequencies for a time display device. An electronic circuit for such a timepiece comprises a CMOS integrated circuit constituted by an N-type substrate. If a noise is applied to an input or output of the CMOS integrated circuit during operation of the circuit, a great abnormal current flows between the $V_{DD}$ terminal and $V_{SS}$ terminal. This phenomenon is called "latch-up". The abnormal current does not stop unless the supply voltage $V_{DD}$ is sufficiently decreased or cut off.

SUMMARY OF THE INVENTION

The present invention seeks to prevent latch-up in the CMOS integrated circuit.

In accordance with the present invention, there is provided an electronic timepiece having a quartz crystal oscillator for producing a time standard signal, a frequency divider for dividing the time standard signal, a display device, and a voltage supply, comprising a CMOS integrated circuit including a logic circuit, which is provided on an N-type substrate for said elements; a first aluminum lead provided on said CMOS integrated circuit for connecting the high potential side of said voltage supply to said N-type substrate; a second aluminum lead provided on said N-type substrate for supplying the voltage to said logic circuit; and a resistor provided between said second aluminum lead and said high potential side.

DESCRIPTION OF THE PREFERRED EMBODIMENT

Figure 1:
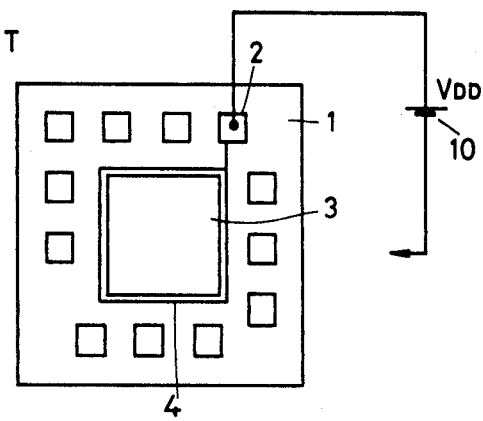
FIGS. 1 and 2 are schematic diagrams of conventional CMOS integrated circuits, respectively.

Referring to FIG. 1 showing a prior-art aluminum wiring system, numeral 1 designates an N-type substrate of a CMOS integrated circuit. The N-type substrate has a logic circuit portion 3. The high potential side voltage $V_{DD}$ of a voltage supply 10 is supplied to the logic circuit portion 3 through a bonding pad 2 and an aluminum lead 4. The aluminum lead 4 is in contact with the N-type substrate 1 at various portions thereof through a plurality of N+ impurity regions of high impurity concentration. Although the system of FIG. 1 is generally sufficient, the measure against the latch-up is not sufficiently given. In order to prevent the latch-up, the power supply high potential side $V_{DD}$ must be connected to the N-type substrate 1 with a very low resistance. The reason is that an SCR structure is formed in the CMOS transistor by a lateral structure formed by a P-channel MOS transistor and an N-channel MOS transistor in the CMOS transistor and that in order to decrease the trigger voltage of the SCR, it is necessary to reduce the resistance between the voltage supply and a portion of the substrate corresponding to the back gate of the MOS transistor. The system of FIG. 1, however, can not sufficiently prevent the latch-up, because the resistance of the aluminum wiring and other resistances are added thereto.

Figure 2:
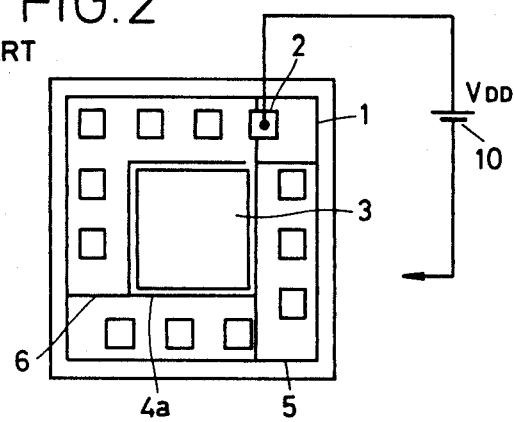

To overcome this drawback, in the system of FIG. 2 the aluminum wiring comprises an aluminum lead 4a mainly for the logic circuit portion 3 and a lead 5 for connecting the N-type substrate to $V_{DD}$. The lead 5 is connected to N+ regions doped in the N-type substrate beneath the lead through contact holes formed in an oxide provided on the surface of the integrated circuit. Both leads 4a and 5 are connected with each other by leads 6. Thus, the N-type substrate 1 is connected to the high potential side $V_{DD}$ with a low resistance.

This system of FIG. 2, however, has a drawback. While the resistance between the wiring and the N-type substrate is reduced, the resistance between the wiring and the logic circuit section 3 is also reduced. Therefore, noise pulses are directly led to the voltage supply, so that the series resistance between the voltage supply and logic circuit portion 3, which is one of the measures for preventing the latch-up, is extremely reduced. As a result, a large current "I" is caused at the time of the generation of a noise pulse, thus generating a trigger pulse voltage causing the latch-up.

In other words, the resistance R in the IR product of the structure for producing the trigger pulse voltage in the system of FIG. 1 is too high, while in the system of FIG. 2 the current I is too high because of the absence of a resistance limiting the current to the logic circuit portion 3. Thus, in either system the trigger voltage generates the latch-up.

Figure 3:
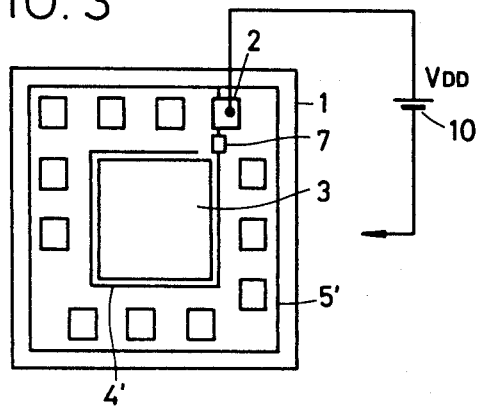
FIG. 3 is a schematic diagram of a CMOS integrated circuit according to the present invention.

The present invention is intended to overcome the drawbacks inherent in the systems shown in FIGS. 1 and 2. FIG. 3 shows the system according to the present invention. In this system, the aluminum wiring comprises a first lead 5' connected to the voltage supply high potential side $V_{DD}$ through the bonding pad 2 and a second lead 4' for the logic circuit portion 3. The first aluminum lead 5' is connected to the N-type substrate 1 by means of the N+ region doped in the substrate and the contact holes as described about the system of FIG. 2. The second aluminum lead is connected to the logic circuit portion 3 through a series resistor 7 for prevention of the latch-up which is formed by a diffusion resistor or a polysilicon resistor having a resistance of 100 to 300 ohms.

In accordance with the present invention, the resistance R between the voltage supply and the N-type substrate is decreased by the first lead 5' and also the peak current I due to the noise pulse is restricted by the series resistor 7 for reducing the IR product.

Thus, it is possible to very effectively prevent the latch-up caused by the noise pulse from a buzzer or the like used in the electronic timepiece. Although in the above embodiment the supply voltage is applied to the logic circuit only through the series resistor 7 and the second lead 4', the supply voltage may be supplied through the first aluminum lead 5' to a portion of the logic circuit for which a very low "on" state resistance is required, such as a portion for pulse motor for the display device.

What is claimed is:

1. A CMOS integrated circuit including a logic circuit for an electric timepiece comprising:
    an N-type substrate;
    a connecting portion provided on said N-type substrate for connecting a high potential side of a voltage supply to said N-type substrate;

a plurality of N+ impurity regions of high impurity concentration formed in said N-type substrate;

a first aluminum lead connected to said impurity regions formed in said N-type substrate, and to said connecting portion for decreasing resistance between said voltage supply and said substrate;

a second aluminum lead provided on said N-type substrate for supplying a voltage to said logic circuit; and a resistor provided between said second aluminum lead and said connecting portion.

2. The CMOS integrated circuit according to claim 1, wherein said resistor is a diffusion resistor provided in said N-type substrate.

3. The CMOS integrated circuit according to claim 1, wherein said resistor is a polysilicon resistor provided in said N-type substrate.

4. The CMOS integrated circuit according to claim 1, wherein said connecting portion is a bonding pad provided in said N-type substrate.

5. The CMOS integrated circuit according to claim 1, wherein said first aluminum lead is positioned outside the bonding pad and said second aluminum lead is positioned inside the bonding paid.

* * * * *